United States Patent
Suvorov

(10) Patent No.: US 7,476,594 B2
(45) Date of Patent: Jan. 13, 2009

(54) METHODS OF FABRICATING SILICON NITRIDE REGIONS IN SILICON CARBIDE AND RESULTING STRUCTURES

(75) Inventor: Alexander V. Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 389 days.

(21) Appl. No.: 11/093,586

(22) Filed: Mar. 30, 2005

(65) Prior Publication Data

US 2006/0226482 A1 Oct. 12, 2006

(51) Int. Cl.
*H01L 21/76* (2006.01)

(52) U.S. Cl. .................. 438/407; 438/295; 438/791; 438/931

(58) Field of Classification Search .......... 438/407, 438/295, 791, 937
See application file for complete search history.

(56) References Cited

U.S. PATENT DOCUMENTS

| | | | |
|---|---|---|---|
| 3,830,668 A | 8/1974 | Dearnaley et al. | |
| 4,824,795 A | 4/1989 | Blanchard | |
| 5,087,576 A | 2/1992 | Edmond et al. | |
| 5,241,211 A | 8/1993 | Tashiro | |
| 5,270,554 A | 12/1993 | Palmour | |
| 5,436,175 A * | 7/1995 | Nakato et al. ............. | 438/766 |
| 5,455,432 A | 10/1995 | Hartsell et al. | |
| 5,543,637 A | 8/1996 | Baliga | |
| 5,681,762 A | 10/1997 | Baliga | |
| 5,856,231 A | 1/1999 | Niemann et al. | |
| 5,950,076 A | 9/1999 | Baliga | |
| 6,069,054 A * | 5/2000 | Choi ........................ | 438/423 |
| 6,075,259 A | 6/2000 | Baliga | |
| 6,096,627 A | 8/2000 | Harris et al. | |
| 6,121,633 A | 9/2000 | Singh et al. | |
| 6,242,298 B1 | 6/2001 | Kawakubo | |
| 6,281,521 B1 | 8/2001 | Singh | |
| 6,294,444 B1 | 9/2001 | Ueno | |
| 6,300,218 B1 | 10/2001 | Cohen et al. | |
| 6,303,475 B1 | 10/2001 | Suvorov et al. | |

(Continued)

FOREIGN PATENT DOCUMENTS

EP   1 450 394 A   8/2004

(Continued)

OTHER PUBLICATIONS

System Optimization Information Website; Silicon-On-Insulator Technology; www.sysopt.com; 8 pages, 2000.

(Continued)

*Primary Examiner*—Zandra V. Smith
*Assistant Examiner*—Colleen E Rodgers
(74) *Attorney, Agent, or Firm*—Summa, Additon & Ashe, P.A.

(57) ABSTRACT

A method is disclosed for fabricating a silicon nitride regions in silicon carbide. The method includes the steps of implanting a sufficient dose and energy of nitrogen ions into a silicon carbide substrate maintained at a temperature above about 350° C. to produce an as-implanted layer of a silicon nitride composition in the silicon carbide, and annealing the as-implanted layer to form a silicon nitride composition. In some embodiments, the formed region of silicon nitride provides an insulating layer. In some embodiments, the silicon nitride region is buried under a surface layer of silicon carbide. Methods of separating silicon carbide by implantation and lift-off are additionally disclosed.

11 Claims, 9 Drawing Sheets

U.S. PATENT DOCUMENTS

| | | | |
|---|---|---|---|
| 6,344,663 | B1 | 2/2002 | Slater, Jr. et al. |
| 6,380,589 | B1 | 4/2002 | Krivokapic |
| 6,406,983 | B1 | 6/2002 | Hölzlein et al. |
| 6,429,459 | B1 | 8/2002 | Wondrak et al. |
| 6,501,135 | B1 | 12/2002 | Krivokapic |
| 6,567,717 | B2 | 5/2003 | Krivokapic . |
| 6,593,173 | B1 | 7/2003 | Anc et al. |
| 6,600,192 | B1 | 7/2003 | Sugawara et al. |
| 6,605,321 | B1 | 8/2003 | Ravelosona-Ramasitera et al. |
| 6,686,616 | B1 | 2/2004 | Allen et al. |
| 6,759,684 | B2 | 7/2004 | Fukuda et al. |
| 6,787,816 | B1 | 9/2004 | Chow et al. |
| 6,812,102 | B2 | 11/2004 | Fukuda et al. |
| 6,812,523 | B1 | 11/2004 | Chu et al. |
| 2003/0180980 | A1 | 9/2003 | Margalith et al. |

OTHER PUBLICATIONS

Gelder et al., "The Etching of Silicon Nitride in Phosphoric Acid with Silicon Dioxide as a Mask", J. Electrochem Soc.: Solid State Science, Aug. 1967.

Schmidt et al.; "Nitrogen self-diffusion in silicon nitride thin films probed with isotope heterostructures", Applied Physics Letter; vol. 85, No. 4, Jul. 26, 2004.

D.K. Sadana and M. Current, "Fabrication of Silicon-On-Insulator (SOI) Wafers Using Ion Implantation", in Ion Implantation Science and Technology, Edited by J. F. Ziegler, Ion Implantation Technology Co., 2000, pp. 341-374.

Deng Z-W, et al, "XPS Studies on silicon carbonitride films prepared by sequential implantation of nitrogen and carbon into silicon," Diamond and Related Materials, Elsevier Science Publishers, Amsterdam, NL, vol. 11, No. 9, (Sep. 2002); pp. 1676-1682.

Link, F et al, "C and N depth profiles of SiCN layers determined with nuclear reaction analyses and AES," Nuclear Instruments & Methods in Physics Research, Section B: Beam Interactions with Materials and Atoms, Elsevier, Amsterdam, NL, vol. 139, No. 1-4, (Apr. 1998); pp. 268-272.

* cited by examiner

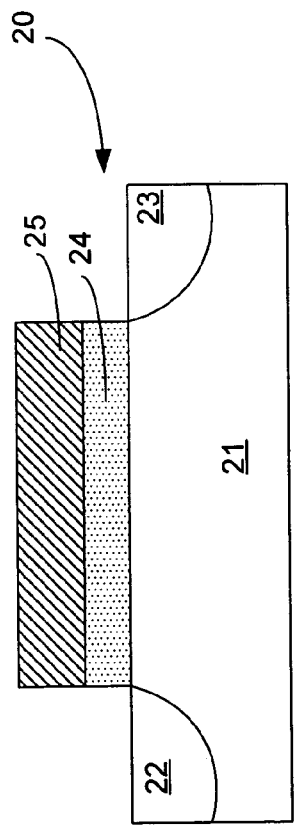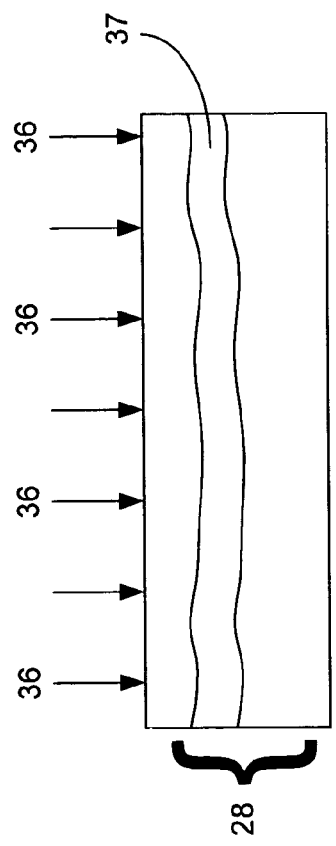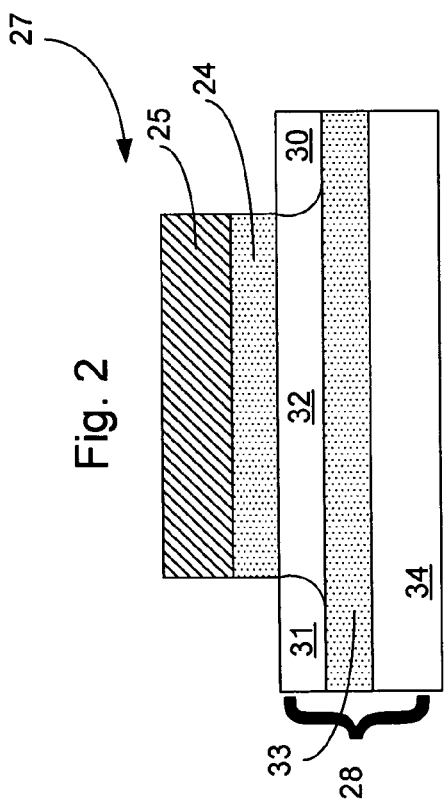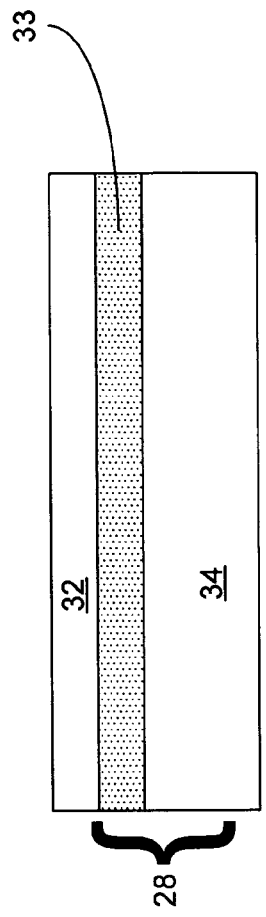

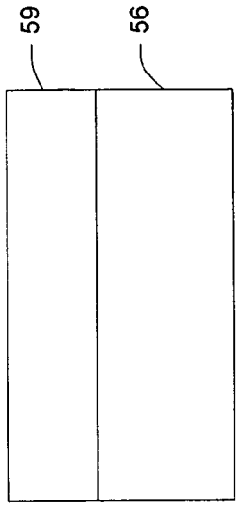
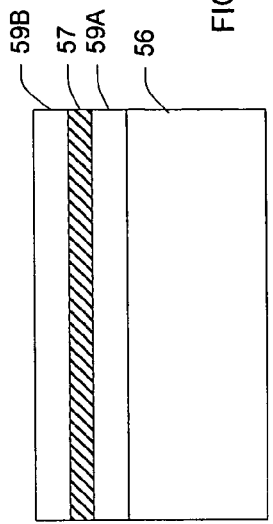
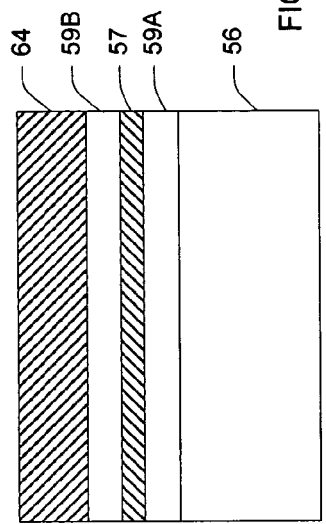
FIG. 12A
FIG. 12B
FIG. 12C
FIG. 12D
FIG. 11A
FIG. 11B
FIG. 11C
FIG. 11D

METHODS OF FABRICATING SILICON NITRIDE REGIONS IN SILICON CARBIDE AND RESULTING STRUCTURES

BACKGROUND

The present invention relates to electronic devices formed in silicon carbide (SiC) and in particular relates to devices that incorporate insulating layers or substrates in or with silicon carbide.

Because of its favorable electronic properties, silicon carbide is theoretically well-suited for high power, high frequency devices, including by way of example and not limitation those that operate in the microwave and related frequency ranges.

Many such devices require the use of highly resistive substrates or layers in order to operate at such power levels and frequency ranges. Accordingly, a number of techniques have been developed to controllably produce silicon carbide with the desired properties.

As further background, the terms, "insulating," "highly resistive," "high resistivity," and "semi-insulating," tend to be used interchangeably in the context of certain types of silicon carbide-based devices. Accordingly, they will be used in that sense herein with any different uses of these terms being clear in context.

Some presently favored techniques for obtaining semi-insulating silicon carbide require either highly purified materials or precise doping control or both to create a desired and relatively exact compensation of dopants in the silicon carbide. As those of skill in this art are aware, compensating silicon carbide with both acceptor dopants and donor dopants, potentially also including intrinsic or other point defects, can produce the desired semi-insulating properties. These techniques for achieving high resistivity SiC can tend to be relatively complex, however, particularly at the high temperatures (typically in the range of 2000° C.) required to grow silicon carbide.

Other techniques for obtaining the necessary insulating characteristics incorporate oxide layers for this purpose. Oxide layers are somewhat attractive in silicon carbide because silicon carbide will oxidize to form silicon dioxide ($SiO_2$) in a manner analogous to the oxidation of silicon to form silicon dioxide. Thus, thermal oxidation provides one available and familiar technique for obtaining insulating layers or portions from or with silicon carbide.

In some circumstances, however, oxidizing a silicon carbide layer is inappropriate, undesirable, or even unavailable. Such can be the case where the insulating portion or layer is, because of desired or necessary manufacturing techniques, or the structure of the device, buried within other silicon carbide portions. In such a case, oxygen can be included in a manner analogous to silicon-on-oxide and SIMOX technologies.

Silicon-on-oxide (also referred to as "silicon-on-insulator" or "SOI") is well understood in the art and provides a technique for manufacturing oxide-gate transistors that are both smaller and can operate at higher frequencies than earlier generations of metal oxide semiconductor field effect transistors (MOSFETs or MOS) or complementary metal oxide semiconductor field effect transistors (typically referred to as CMOS).

Silicon-on-insulator places a transistor's silicon junction area on top of an electrical insulator, typically silicon dioxide. The SOI technique (and resulting structure) minimizes the capacitance of the gate area. By doing so, SOI minimizes gate capacitance, and thus reduces the charging and discharging time required by the MOS gate, which in turn permits faster transistor operation.

Silicon-on-insulator, however, usually requires placing a crystalline silicon layer (or analogously an SiC layer) on top of a generally amorphous silicon dioxide layer. For a number of reasons related to crystal growth, such a structural requirement presents greater technical complexity and less cost-effectiveness than is otherwise desirable for the resulting devices and circuits.

A potential solution was initially developed by IBM in the form of separation by implantation of oxygen, commonly referred to as SIMOX. The SIMOX process consists of two basic steps. In the first, oxygen ions are implanted into a wafer forming an insulating layer that separates two portions of silicon. A high-temperature anneal repairs implantation damage and produces the desired buried $SiO_2$ insulating layer. Devices (e.g., transistors) are then built upon the top silicon layer. The technique produces high quality silicon-on-insulator wafers.

Although silicon-on-insulator in general and SIMOX in particular have their own advantages, adding oxygen to silicon carbide requires an implantation ratio of 2.00 (for $SiO_2$) using atoms having an atomic mass of 16. Both of these factors can damage those portions of the silicon carbide through which the ions are implanted.

In turn, repairing implantation damage adds an additional manufacturing step, and if the damage is overly-extensive, it can simply render the wafer (or wafer portion) useless. Given the greater complexity of producing and handling silicon carbide as compared to silicon, the damage raised by implantation provides a similarly greater problem and technical hurdle.

As another issue, oxygen diffuses in silicon carbide. As a result, in silicon carbide-on-insulator structures, oxygen from the insulator layer can diffuse into the device layers. The diffused oxygen can create undesired oxides or otherwise interfere with the SiC layers and reduce or destroy their structural and functional characteristics and advantages.

As yet another problem, because many devices in silicon carbide are based upon epitaxial growth and resulting epitaxial layers on silicon carbide, damaging a substrate or base layer produces a damaged structure that must be cured or otherwise addressed before further satisfactory epitaxial growth can be carried out upon it.

Accordingly, techniques that can (or could) provide such buried insulating layers while avoiding these disadvantages offer corresponding advantages in silicon carbide device technology.

SUMMARY

In one aspect, the invention provides a method of forming a region of silicon nitride within silicon carbide. In this aspect, the method comprises implanting a sufficient dose of nitrogen ions (atomic or molecular) into a silicon carbide layer maintained at a temperature of at least about 350° C. to produce an as-implanted layer of a silicon nitride composition in the silicon carbide layer. In some embodiments, the as-implanted layer may be annealed to form a silicon nitride composition insulating region within a layer of silicon carbide and/or buried under a surface layer of silicon carbide. In some embodiments, the silicon carbide layer may include an epitaxial silicon carbide layer grown on a growth substrate or wafer. In other embodiments, the silicon carbide layer includes a bulk silicon carbide substrate or wafer.

In another aspect, the invention provides a method of insulating discrete devices in integrated circuits by selectively masking portions of an integrated circuit formed in a silicon carbide layer with a masking material that prevents penetration of nitrogen ions, and then implanting a sufficient dose and energy of nitrogen ions into the unmasked portions of the integrated circuit and the silicon carbide layer to produce an as-implanted layer of the silicon nitride composition in the unmasked portions that isolates devices in the circuit from one another.

In another aspect, the invention provides a method of forming an insulated gate semiconductor device in silicon carbide by implanting a sufficient dose of nitrogen ions into a silicon carbide layer having a first conductivity type while maintaining the substrate at a temperature of at least about 350° C. to produce an as-implanted layer of silicon nitride composition in the silicon carbide layer, annealing the as-implanted layer at a temperature of between about 800° C. and 1700° C. to form a silicon nitride composition insulating layer buried under a surface layer of silicon carbide, forming respective separated source and drain portions in the surface layer of silicon carbide with conductivity types opposite the conductivity type of the silicon carbide layer, adding a gate insulator to the surface portion of silicon carbide between the source and drain portions, and forming a metal gate contact on the gate insulator.

In another aspect the invention provides a method of lifting off a top layer of silicon carbide from a silicon carbide base layer by implanting a sufficient dose and energy of nitrogen ions into a silicon carbide base layer maintained at a temperature of at least about 350° C. to produce and as-implanted layer of a silicon nitride composition in the silicon carbide base layer that separates a silicon carbide surface layer from the silicon carbide base layer, then removing the silicon nitride composition by contacting the silicon carbide layers and the silicon nitride composition with an etchant that removes silicon nitride compositions but not silicon carbide to thereby separate the silicon carbide surface layer from the silicon carbide base layer.

In some embodiments, the invention provides a method of lifting off an epitaxial layer of silicon carbide from a silicon carbide base layer by implanting a sufficient dose and energy of nitrogen ions into a silicon carbide epitaxial layer maintained at a temperature of at least about 350° C. to produce and as-implanted layer of a silicon nitride composition in the silicon carbide epitaxial layer that separates a silicon carbide surface epitaxial layer from the silicon carbide epitaxial layer, then removing the silicon nitride composition by contacting the silicon carbide layers and the silicon nitride composition with an etchant that removes silicon nitride compositions but not silicon carbide to thereby separate the silicon carbide surface epitaxial layer from the silicon carbide epitaxial layer. In some embodiments, a support substrate may be bonded to the silicon carbide surface epitaxial layer prior to separating the surface epitaxial layer from the underlying layer.

In methods according to other embodiments of the invention, an epitaxial layer of silicon carbide or another material such as a Group III-nitride material (e.g. GaN, AlGaN, InGaN, AlN, InN, AlInGaN, AlN etc.) may be grown on the surface layer of silicon carbide prior to or after separation. Electronic devices may be formed in the surface layer of silicon carbide or in an epitaxial layer formed on the silicon carbide surface layer before or after separation. In addition, the separated layers may be used to provide a template for further epitaxial growth.

In another aspect, the invention provides a transistor comprising a silicon carbide layer with a first conductivity type, a buried silicon nitride insulating layer in the silicon carbide layer that defines a first conductivity type silicon carbide portion beneath the insulating layer and another first conductivity type silicon carbide portion above the insulating layer, respective separated source and drain regions in the silicon carbide layer above the buried insulating layer with each of the source and drain regions having a conductivity type opposite from the conductivity type of the silicon carbide layer, and a gate contact between the source region and the drain region. In another aspect, the invention is a transistor comprising a silicon carbide layer with a first conductivity type, a buried silicon nitride insulating layer in the silicon carbide layer that defines a first conductivity type silicon carbide portion beneath the insulating layer and another first conductivity type silicon carbide portion above the insulating layer, respective separated source and drain regions in the silicon carbide layer above the buried insulating layer with each of the source and drain regions having a the same conductivity type as the conductivity type of the silicon carbide layer, a channel region extending between the source and drain regions having a conductivity type opposite the conductivity type of the silicon carbide layer and a gate contact above the channel region.

In yet another aspect, the invention is a silicon carbide layer comprising a buried implanted insulating layer of a silicon nitride composition, a silicon carbide portion beneath the insulating layer, and a silicon carbide portion on the insulating layer.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIG. 1 is a schematic cross-sectional diagram of one type of conventional metal oxide semiconductor device.

FIG. 2 is a similar schematic cross-sectional diagram for a semiconductor-on-insulator device according to the present invention.

FIG. 3 is a schematic cross-sectional diagram representing implantation according to the present invention.

FIG. 4 is a schematic cross-sectional diagram of a resulting wafer structure according to the present invention.

FIGS. 11-14 are cross sectional schematic diagrams illustrating layer separation according to embodiments of the invention.

DETAILED DESCRIPTION

Figure 5:
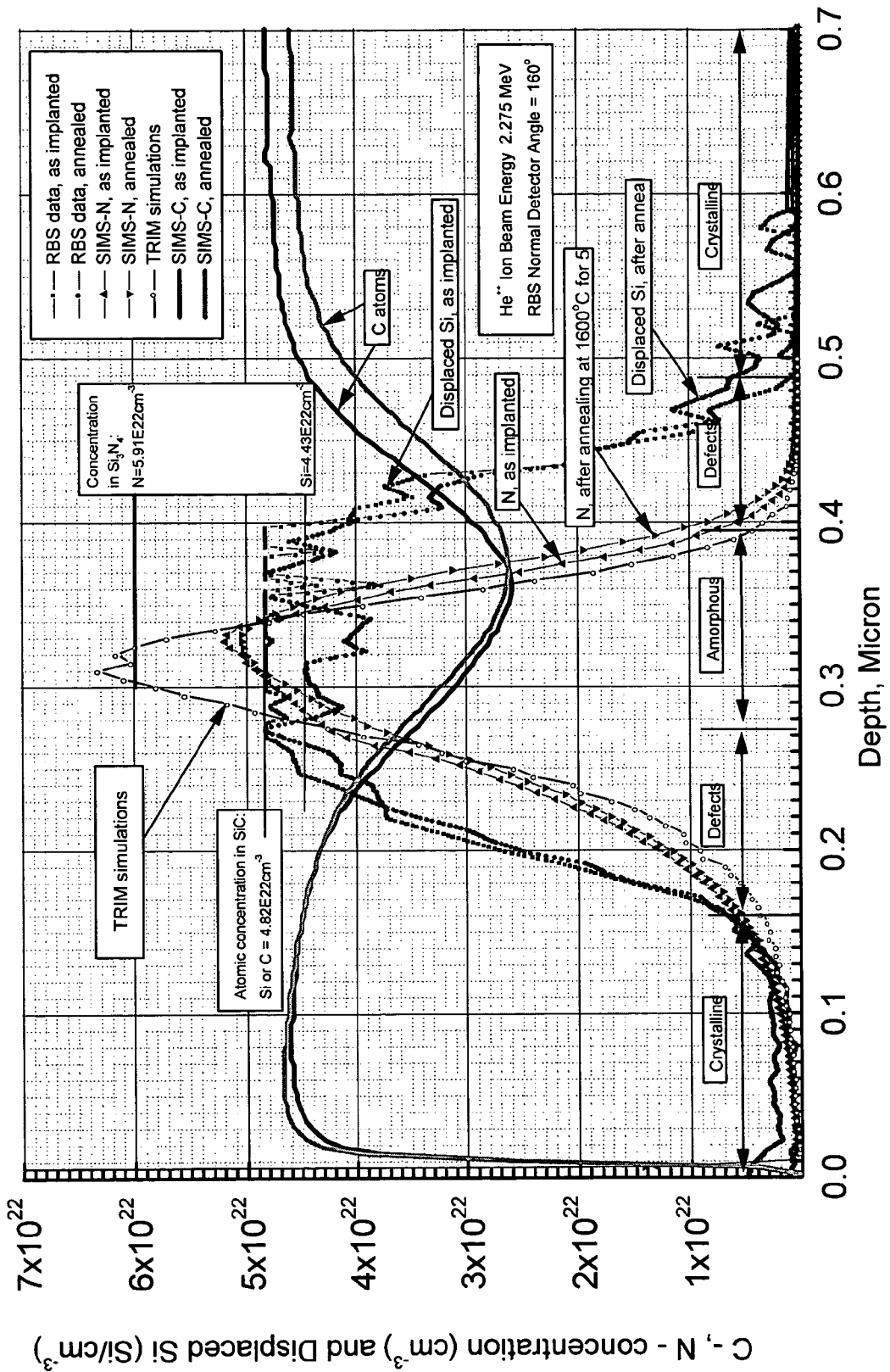
FIG. 5 is a linear scale plot of SIMS, RBS and TRIM data for a silicon carbide wafer according to the present invention.

In a first aspect, the invention provides a method of forming a region of silicon nitride within silicon carbide. In this aspect, the method includes the steps of implanting a sufficient dose and energy of nitrogen ions into a silicon carbide layer maintained at a temperature above about 350° C. to produce an as-implanted layer of a silicon nitride composition in the silicon carbide layer, In a second aspect, the invention is a method of fabricating an insulating layer in silicon carbide. In this aspect, the method includes the steps of implanting a sufficient dose and energy of nitrogen ions into a silicon carbide layer maintained at a temperature above about 350° C. to produce an as-implanted layer of a silicon nitride composition in the silicon carbide layer, and then annealing the as-implanted layer to form a silicon nitride composition insulating layer within the silicon carbide layer. In some embodiments, the silicon carbide layer may include an epitaxial silicon carbide layer grown on a growth substrate or wafer. In other embodiments, the silicon carbide layer includes a bulk silicon carbide substrate or wafer.

The implanting dose and energy are selected to be sufficient to produce the buried insulating layer while avoiding excessive crystal damage to the silicon carbide layer, particularly the silicon carbide portion above the buried layer. In most circumstances, this can comprise implanting a dose of between about $5\times10^{17}$ and $4\times10^{18}$ per square centimeter (5E17 cm$^{-2}$ and 4E18 cm$^{-2}$) at an energy of at least about 50 keV, and preferably between about 100 and 300 keV.

As known to those familiar with implantation techniques, the term "dose" refers to the number of ions per square centimeter directed at the target of interest and does not, standing alone, indicate the energy with which they are directed at the target. The energy of the ions is used to design or obtain the depth at which the ions will be implanted. Thus, energy produces the desired depth while dose produces the desired concentration at the depth determined by the energy. Because dosage and energy address different aspects, implantation, including implantation according to the present invention, can be carried out in multiple steps in which some or all of the steps are carried out at different doses or different energies or both to thereby broaden the depth of the implanted portion as well as potentially create different concentrations of the implanted ions at different positions within the overall implanted portion.

Those familiar with ion implantation will recognize that the dosage, the energy, and combinations of doses and energies carried out successively, can be used to produce the necessary or desired implanted layers. Functionally, the numerical value of the dosage must be sufficient to create an as-implanted layer that can be annealed into the buried insulating layer, but should be moderate enough to avoid creating extensive damage on the surface or within the silicon carbide target. Different dosages and energies can be used when, as described further herein, the implantation and insulating technique of the present invention is used to separate or isolate devices from one another. Thus, as used herein phrases such as, "a sufficient dose and energy" are used to refer to the fact that an implantation step includes both a quantity of ions on a per area basis and an energy at which those ions are directed at the target being implanted. These uses are also clear in context, particularly to those of skill in this art.

Accordingly, this step can be carried out by those of ordinary skill in this art without undue experimentation.

Using the invention, the implantation can be carried out on silicon carbide that is a single crystal, polycrystalline or even amorphous. The silicon carbide can be intrinsic or it can be conductively doped (p or n). When the silicon carbide is a single crystal, it can have a polytype selected from the group consisting of the 3C, 2H, 4H, 6H, and 15R polytypes of silicon carbide.

During implantation, the substrate is maintained at a temperature of at least about 350° C. to prevent or moderate implantation damage to the silicon carbide crystal structure, which in many cases is intended to start as and remain single crystal in character. Techniques for ion implantation into silicon carbide at elevated temperatures are set forth in U.S. Pat. No. 5,087,576, the contents of which are incorporated entirely herein by reference. These techniques have been generally adopted and are now well understood by persons of ordinary skill in this art. Thus, the temperature aspects of the implantation step can likewise be carried out by those of ordinary skill in this art without undue experimentation.

In most circumstances, the implantation will be carried out while the substrate is maintained at a temperature of at least about 350° C., and most typically between about 500 and 1000° C.

After implantation, the buried layer is annealed to form a silicon nitride composition insulating layer that is buried under a surface layer of silicon carbide. The annealing temperature is typically sufficient to increase the crystal order of the implanted layer. In some embodiments, the annealing temperature may be less than a temperature that would produce undesired effects on the silicon carbide crystal, particularly undesired effects on the surface. Accordingly, the annealing step is typically carried out at temperatures of between about 800° C. and 1700° C., and most typically between about 1200° C. and 1500° C.

Using the dosage and energy levels, the buried insulating layer is fabricated with a thickness sufficient to reduce capacitive coupling between devices and circuits formed in the surface layer and the underlying silicon carbide layer. Thus, once the thickness of the buried insulating layer is sufficient for its intended purpose, increasing the thickness may offer no further functional advantage. Accordingly, a typical buried insulating layer will have a thickness of at least about 1000 angstroms (Å).

In experiments carried out to date, nitrogen ions have been implanted at a dose of 7E17 cm$^{-2}$ at an energy of about 200 keV while maintaining the silicon carbide layer at a temperature of between about 650 and 1100° C., and then annealing the implanted layer at a temperature of about 1600° C. for about five minutes.

In another aspect, the method can be used to insulate discrete devices in integrated circuits. In this aspect, the invention comprises selectively masking portions of an integrated circuit formed in a silicon carbide layer with a masking material that prevents penetration of nitrogen ions, and then implanting a sufficient dose of nitrogen ions into the unmasked portions of the integrated circuit and the silicon carbide layer to produce an as-implanted layer of the silicon nitride composition in the unmasked portions that isolates devices in the circuit from one another.

In this aspect, the implanted layer can also be annealed, although the decision to anneal and the temperature at which annealing is carried out will be selected depending upon the presence of other elements are in the circuit and what effects, desired or undesired, the annealing temperature will have upon them.

Alternatively, the method can comprise selectively masking portions of the silicon carbide layer, then implanting the nitrogen ions to produce a patterned implanted layer of silicon nitride composition in the unmasked portions, and thereafter forming semiconductor devices in the portions of the pattern silicon carbide layer that are separated and electronically isolated by the patterned buried implanted layer. In this method, because implantation precedes formation of the semiconductor devices, the annealing step (if desired) can be carried out at temperatures suitable for the silicon carbide and the silicon nitride without regard to devices that have not yet been formed.

It will be understood by those of skill in this art that when used to insulate discrete devices in integrated circuits, these insulating portions will be positioned somewhat differently than will be the "buried" portions described elsewhere herein. Such insulating or isolating portions and the associated methods of obtaining them extend all the way through the desired layers necessary to insulate or isolate the desired devices from one another. Thus in some cases the implantation may extend throughout all the layers while another cases the implanted insulation will extend only through a selected number of layers.

In another aspect, the invention is a method of forming semiconductor devices in silicon carbide. Most such devices are transistors, specifically field effect transistors, and are referred to by a variety of designations and acronyms that are well and widely understood in this art. Commonly used designations include MESFET, JFET and MOSFET, as well as MOST and IGFET. It will be understood that the invention described herein can be advantageously incorporated into a variety of these structures.

In this aspect of the method, the method includes implanting a sufficient dose of nitrogen ions into a silicon carbide layer having a first conductivity type while maintaining the layer at a temperature of at least about 350° C. to produce an as-implanted layer of silicon nitride composition in the silicon carbide layer. The as-implanted layer is then annealed at a temperature of between about 800° C. and 1700° C. to form a silicon nitride composition insulating layer buried under a surface layer of silicon carbide. Respective separated source and drain portions are then formed in the surface layer of silicon carbide (e.g., by ion implantation) with conductivity types opposite the conductivity type of the silicon carbide layer. For insulated-gate devices a gate insulator is formed on the surface portion of the silicon carbide between the source and drain portions and a metal gate contact is thereafter formed on the gate insulator. For MESFETs and related structures, the gate contact is typically formed directly on the silicon carbide surface.

As noted above, in most, but not all, insulated-gate structures the insulator will be an oxide, most typically silicon dioxide ($SiO_2$) formed by thermal oxidation of silicon carbide.

FIG. 1 is a schematic cross-sectional view of a conventional metal oxide field effect transistor (MOSFET) generally designated at 20. The basic elements of the transistor 20 include a silicon carbide substrate 21 (or any equivalent SiC portion or layer) having a first conductivity type, oppositely doped portions 22 and 23 that respectively form the source and drain of the device, a gate oxide 24 and a metal gate electrode 25. As is well understood in the semiconductor art, applying a sufficient voltage to the metal contact 25 creates an inversion region between the source 22 and the drain 23 thereby opening a channel to permit current flow between the source and drain and turning the device on. While the device illustrated in FIG. 1 is a normally off, enhancement mode MOSFET, it will be understood by those having skill in the art that other types of devices may be formed within substrate 21 in addition to or instead of transistor 20, such as depletion mode field effect transistors, junction field effect transistors, bipolar transistors, capacitors, diodes, and the like. The design of such devices is well known in the art.

Thus, in another aspect the invention can be understood with respect to FIG. 2 as the resulting transistor designated at 27. The transistor 27 includes a silicon carbide substrate or layer designated by the brackets 28 with a first conductivity type, a buried silicon nitride insulating layer 33 in the silicon carbide substrate 28 that defines a first conductivity type silicon carbide portion 34 beneath the insulating layer 33 and another first conductivity type silicon carbide portion 32 above the insulating layer 33, respective separated source 30 and drain 31 regions in the above-insulating silicon carbide layer 32 with each of the source 30 and drain 31 regions having a conductivity type opposite from the conductivity type of the silicon carbide substrate 28 and a gate contact 25 on the gate oxide 24 between the source 30 and the drain 31. As noted above, other types of electronic devices could be formed within portion 32 in addition to or instead of transistor 27.

It will be understood that such a transistor can also be of the metal-semiconductor or junction field-effect type that does not include the gate insulator.

The structural variables, function, and operating parameters that can be incorporated with or designed into field effect transistors are well understood in the art and need not be specifically repeated here apart from the context of the present invention. Appropriate discussions of such devices and their theory, structure and operation are set forth for example in Chapters 7 and 8 of Sze, Physics Of Semiconductor Devices, Second Edition, John Wiley and Sons (1981), or in Dorff, The Electrical Engineering Handbook, Second Edition, CRC Press (1997).

In yet another aspect, it will be understood that the method can be used to lift off a surface layer of silicon carbide from an underlying silicon carbide layer. In this aspect, the method comprises implanting a sufficient dose of nitrogen ions into a silicon carbide layer maintained at a temperature of at least about 350° C. to produce and as-implanted layer of a silicon nitride composition in the silicon carbide layer that separates the surface silicon carbide layer from the underlying silicon carbide layer. The silicon nitride composition is then removed by contacting the wafer and the silicon nitride composition with a composition (typically an etchant) that removes silicon nitride compositions but not silicon carbide to thereby separate the two respective silicon carbide portions defined by the implanted nitride layer.

In this method, phosphoric acid ($H_3PO_4$) is a suitable etchant and the etch step is usually carrying out at an elevated temperature; e.g. about 100-150° C.

If desired or necessary, the implanted layer can be annealed prior to the step of removing the silicon nitride composition. The annealing step tends to improve the crystal structure and thus more clearly defines the silicon nitride buried insulator layer. This in turn increases the definition of the resulting separated silicon carbide portions.

In yet another aspect, the invention is a silicon carbide layer that includes a buried, implanted, and annealed silicon nitride composition insulating layer with a silicon carbide portion beneath the insulating layer and a silicon carbide portion on the insulating layer.

In this aspect, as in the others, in order to provide the insulating function, the buried insulating layer has a resistivity of at least about 1500 ohm-centimeters ($\Omega$-cm), in some cases 5000 $\Omega$-cm, in some cases 10,000 $\Omega$-cm, and in some cases 50,000 $\Omega$-cm. As noted in other portions of the specification, the thickness and resistivity of the buried layer can be tailored by selecting appropriate dosage amounts and implant energies.

In this aspect, the invention may further comprise a metal oxide semiconductor field effect transistor, metal-semiconductor field effect transistor, bipolar transistor or junction field effect transistor formed in the portion of the silicon carbide layer that is on the buried insulating layer. In yet other aspects, the device formed on the silicon carbide portion of the wafer on the buried insulating layer can be selected from a wide group of devices including programmable gate arrays, static memory, dynamic memory, and microprocessors.

FIGS. 3 and 4 are schematic illustrations of certain aspects of the invention. FIG. 3 again illustrates a silicon carbide layer 28 along with a series of arrows 36 representing the implantation of nitrogen ions into the layer 28 to create the as-implanted layer 37. FIG. 4 schematically represents the layer 28 and the layer 37 after the annealing step. The annealing step helps repair damage to the substrate 28 and increases the crystallinity of the as-implanted layer 37 to produce the buried insulating layer 33 (as commonly numbered in FIG. 2). As previously described, the buried insulating layer 33 separates the substrate 28 into one portion 32 above the insulating layer 33 and a separate portion 34 below the insulating layer 33.

Figure 7:
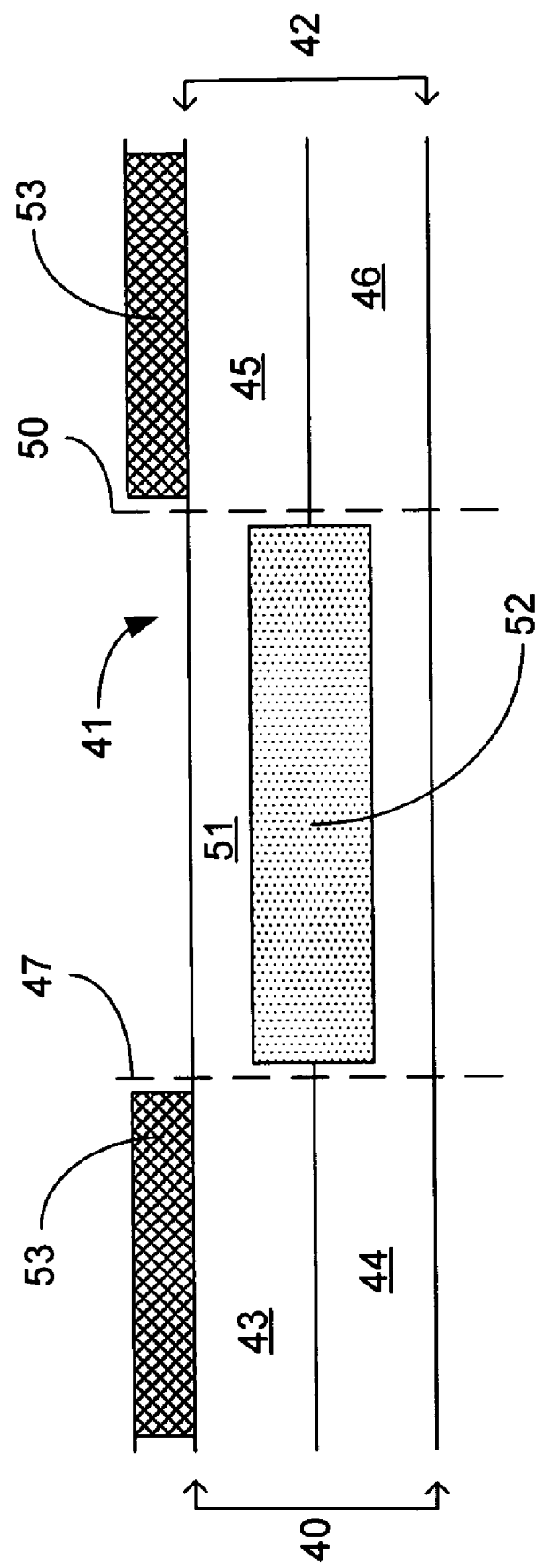
FIG. 7 is a cross-sectional schematic diagram of a device according to the invention used to separate and control to adjoining devices.

FIG. 7 is a schematic diagram in cross-section of three adjacent devices or regions broadly designated at 40, 41, and 42. Devices 40 and 42 are indicated by the brackets and it will be understood that although the devices are illustrated in basic fashion by layers 43 and 44 (for device 40) and 45 and 46 (for device 42), these devices can and will include more structure or complexity that is quite familiar to those of skill in this art. Illustrating the invention, however, does not require that these devices be illustrated in detail. The dashed lines 47 and 50 schematically illustrate the respective positions of the devices 40, 41 and 42 with respect to one another. The device 41, which is also shown in a very broad context including only a single layer 51, is formed upon a buried nitride layer 52 according to the present invention. Thus, such a buried layer and its accompanying device 41 cannot only be formed adjacent or between other devices, but can be designed and operated to form a control or switch as between the respective devices 40 and 42. FIG. 7 illustrates respective masking portions 53 that can be positioned in the appropriate manner to define the position at which the buried nitride layer 52 is to be placed. As noted with respect to the other embodiments, the width and concentration of the buried layer 52 can be designed and accomplished by those of skill in this art by varying the implant energy and dosage of the implantation step or by carrying out several implantation steps using different combinations of dosages and energies.

Figure 6:
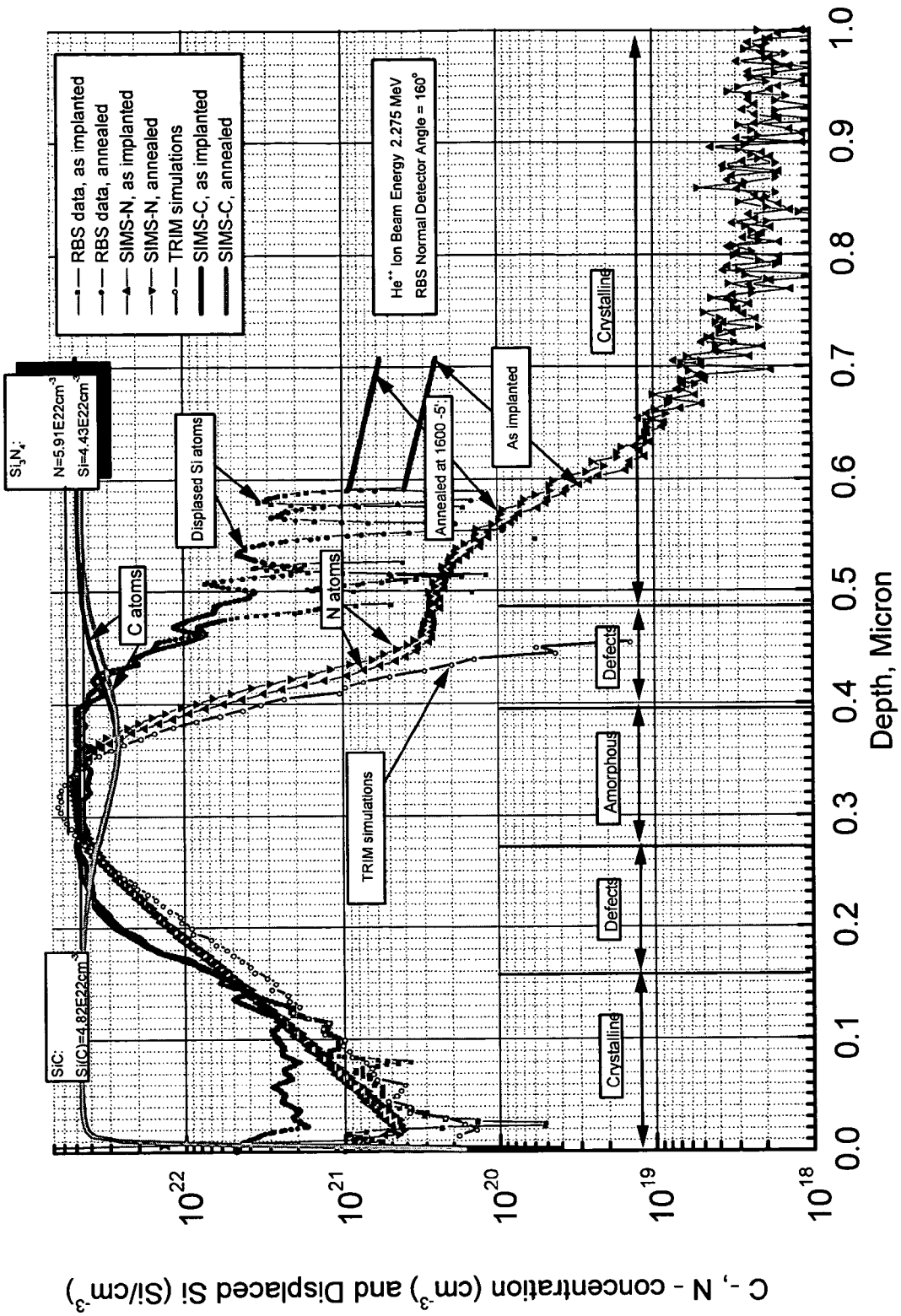
FIG. 6 is a logarithmic scale plot of the same data of FIG. 5

FIGS. 5 and 6 illustrate SIMS and RBS data along with TRIM predictions obtained from a silicon carbide wafer implanted and annealed according to the present invention. The data plotted in FIGS. 5 and 6 is identical, but is presented in respective linear and logarithmic format in the figures. The data plotted in FIGS. 5 and 6 was taken from a 6H silicon carbide substrate implanted with nitrogen ions (N+) at an energy of 200 keV and a dose of $7E17$ cm$^{-2}$ at 650° C.

SIMS, RBS and TRIM are generally well-understood in this art. SIMS (Secondary Ion Mass Spectrometry) is a method of profiling the concentration of elements in a layer through bombardment of a sample surface with a primary ion beam followed by mass spectrometry of the emitted secondary ions. SIMS provides an analysis of trace elements in solid materials, especially semiconductors and thin films. A SIMS primary ion beam can be focused to less than 1 μm in diameter. As a result, the position at which the primary ion beam strikes a sample surface provides for microanalysis and the measurement of the depth distribution of elements on a microscopic scale.

RBS (Rutherford Back Scattering) represents another technique for analyzing material composition by directing ions at a surface. In RBS, high kinetic energy helium ions (e.g., 1-3 MeV) are directed at the sample. The helium ions scatter incident ions from atoms in the sample and the quantity and energy of these scattered ions are measured. RBS can provide information on the crystal damage, composition of the sample, the distribution of elements, the mean average distance or mean range of dopants from the sample surface, and the thickness of the sample. To obtain the present data, the RBS was carried out using helium atoms (He$^{++}$) with a beam energy of 2.275 MeV with the normal detector angle being 160°.

TRIM is an acronym for, "TRansport of Ions in Matter," which is a Monte Carlo-type simulation based on the implanted ions and their energy level. The TRIM predictions are typically compared to the measured SIMS and RBS results.

Figure 10:
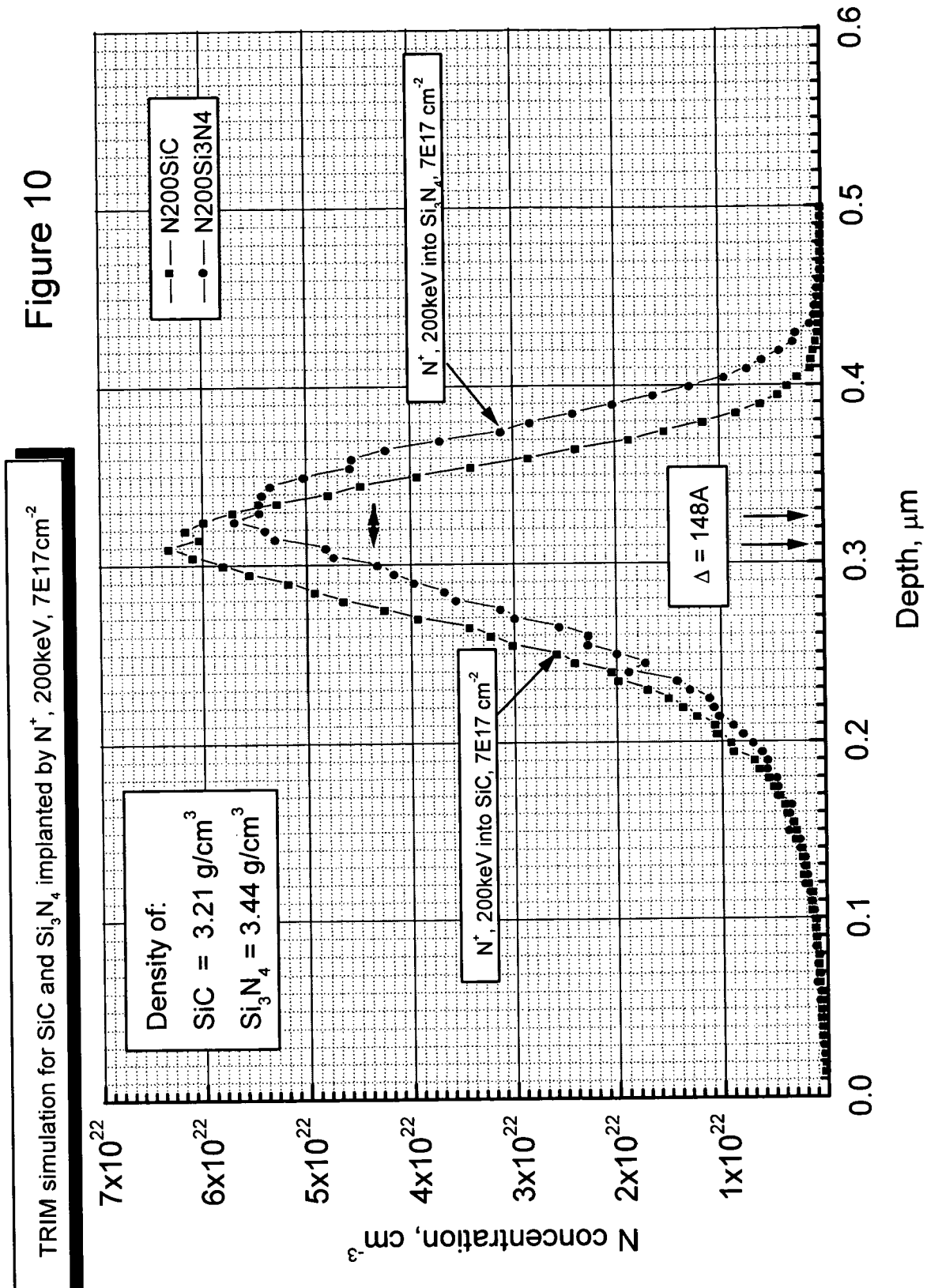
FIG. 10 is a linear scale plot of a simulation for silicon carbide and silicon nitride implanted by atomic nitrogen at particular doses.

In both FIGS. 5 and 6, the predicted concentration of silicon nitride ($Si_3N_4$) is set forth by the line formed of open circles and labeled "TRIM Simulations." FIG. 5 illustrates that the measured SIMS data for nitrogen exhibits an asymmetric peak that is shifted slightly deeper (towards the right in FIG. 5) than the peak of the corresponding nitrogen concentration profile predicted by TRIM simulation. This provides evidence of successful formation of $Si_3N_4$. FIG. 10 (which is entirely a TRIM simulation) compares the implantation of nitrogen into silicon carbide and silicon nitride at the same dose ($7E17$ cm$^{-2}$) and implant energy (200 keV). As FIG. 10 illustrates, when implanted into silicon nitride, the peak concentration of implanted nitrogen is deeper (i.e. shifted to the right) compared with nitrogen implanted into silicon carbide. That is, when nitrogen is implanted into silicon nitride, it tends to go deeper than when it is implanted into silicon carbide under similar conditions. Returning to FIGS. 5 and 6, the TRIM simulation predicts a peak concentration of nitrogen in the silicon carbide layer at about 0.31 μm. However, the SIMS results show that the actual peak concentration of nitrogen is deeper by about 0.02 μm or 200 Å, which indicates that the nitrogen is being implanted into a silicon nitride region. Moreover, the actual nitrogen concentration exhibits an asymmetrical peak that is shifted slightly to the right, which may indicate that the conditions of the implantation step are changing during the process. Although not fully understood, it is presently believed that the data illustrated in FIGS. 5 and 6 indicate that when the implantation process is initiated, the implanted nitrogen begins to form an implant profile similar to the profile predicted by TRIM simulation for implantation of nitrogen in silicon carbide. However, as more nitrogen is implanted into the layer, the region in the vicinity of the implantation peak begins to take on the character of silicon nitride, permitting subsequently implanted nitrogen ions to penetrate deeper and form an implant profile similar to the profile predicted by TRIM simulation for implantation of nitrogen into silicon nitride.

In a corresponding manner, the SIMS data shows that the concentration of carbon atoms, which is high (as expected) between the surface and a depth of 0.2 μm, begins to decrease as the concentration of silicon nitride increases. The concentration of carbon atoms becomes minimized at about 0.37 μm from the surface. At the same time, RBS data indicate that displaced silicon atoms greatly increase in concentration starting at about 0.2 μm from the surface, and only return to a more normal concentration at about 0.6 μm from the surface. From about 0.27 μm to about 0.39 μm from the surface, the concentration of displaced Si atoms is so high that the material in this region can be characterized as amorphous.

According to the Rutherford backscattering data, a sufficient concentration of nitrogen atoms reached the depth predicted by TRIM simulation while only about 5% of the silicon atoms in the top portion of the silicon carbide were displaced under these implant conditions.

The secondary ion mass spectroscopy (SIMS) analysis confirmed that the implanted layer was highly insulating. Although SIMS is nominally a method for measuring the concentration of elements in a layer as a function of depth, the SIMS technique may also indicate the resistivity of the material being profiled. During SIMS measurements, a sample is bombarded by a beam of positively charged oxygen or cesium ions (the primary ions), which strike the sample and cause secondary ions to be ejected from the sample. The bottom of the sample is electrically grounded. If the sample is conductive, the surface of the sample will not become charged during the SIMS process, since electrical current can flow out of the sample (i.e. electrons flow into the sample) to balance the electrical charge gained when positive ions strike the sample and negative ions and electrons are ejected from the sample. If the sample is a dielectric material, or if there is an insulating layer inside the sample, the surface of the sample will become positively charged with static electricity. A build-up of positive charge at the surface of the sample is undesirable, since it will oppose the flow of primary ions and may prevent the primary ions from reaching the surface of the sample with the desired energy level.

To avoid undesired charging effects, it is necessary to take steps such as depositing a very thin gold layer on the top surface of the sample and attaching a ground contact to this layer, or using an electron beam to compensate for positive charge build-up on the surface. The first method (depositing a gold layer) is preferable for depth profiling dielectric or insulating materials; the second method (electron beam compensation) is suitable for depth profiling slightly resistive materials. In this case, it was necessary to deposit a thin gold layer on the surface of the wafer to compensate for charging effects because an electron beam could not provide a sufficient charge compensation current. This observation indicates that the buried $Si_3N_4$ layer in the wafer was highly insulating.

Figure 8:
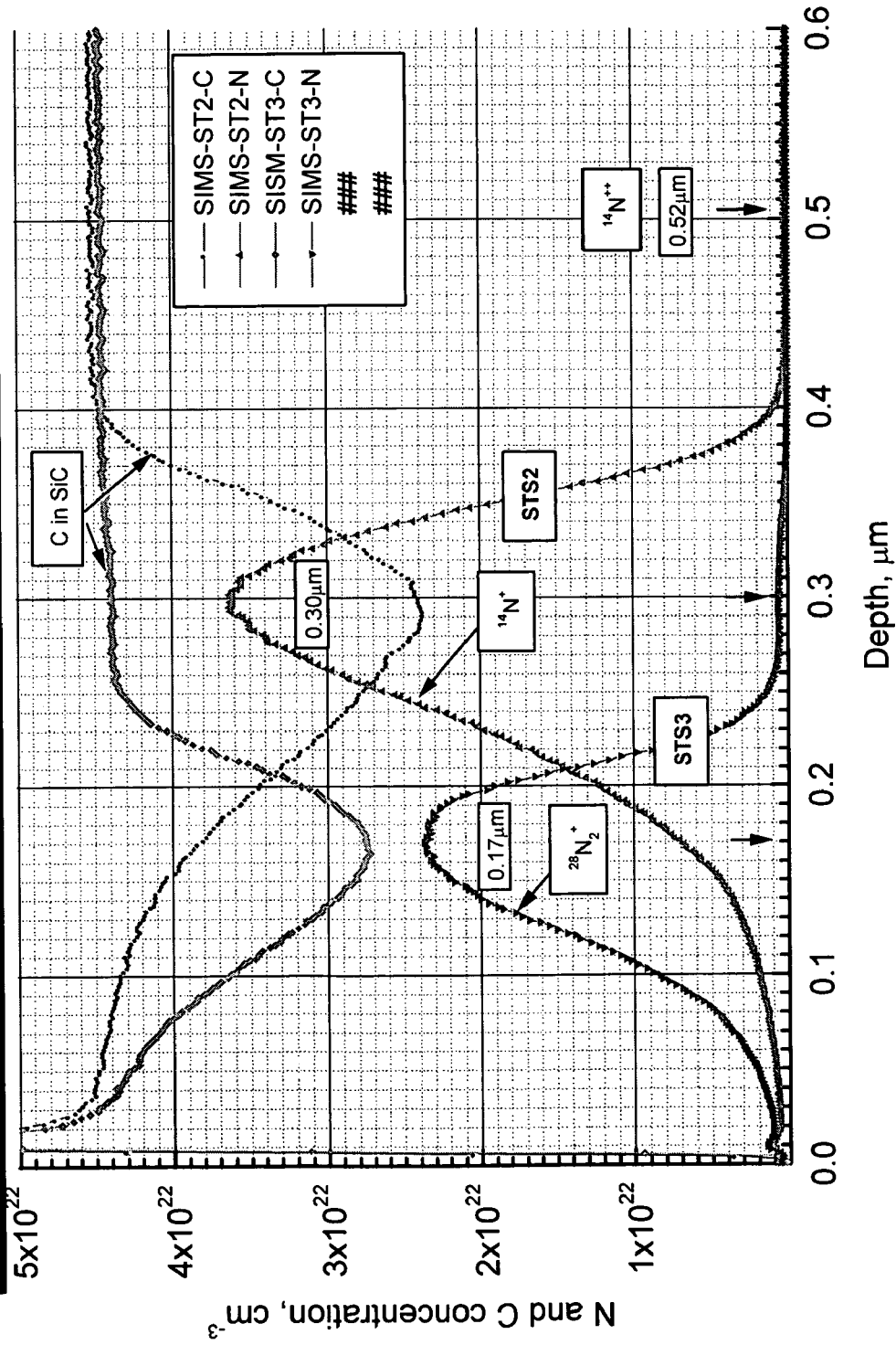
FIG. 8 is a linear scale plot of SIMS data for silicon carbide implanted by nitrogen at 1100° C., versus depth in microns.

FIG. 8 is a plot of nitrogen concentration (SIMS data), expressed on a linear scale, versus depth in microns, following the implantation of two 4H silicon carbide wafers with atomic nitrogen and molecular nitrogen respectively. Both of the implants were performed at an implant energy of 200 keV. The atomic nitrogen ($N^+$) was implanted at a dose of 7E17 $cm^{-2}$, while the molecular nitrogen ($N_2^+$) was implanted at a dose of 3.5E17 $cm^{-2}$, i.e., the same number of individual atoms were implanted. Both implantations were carried out at 1100° C. FIG. 8 demonstrates that molecular nitrogen can be used to intentionally adjust the depth of the insulating layer. As illustrated in FIG. 8, the molecular nitrogen has a peak concentration at a depth of about 0.15 microns, while the atomic nitrogen implanted at the same energy has a peak concentration at a depth of about 0.30 microns. FIG. 8 also illustrates the corresponding carbon concentration, which in each case reaches a minimum that substantially corresponds with the peak concentration of the various nitrogen.

Figure 9:
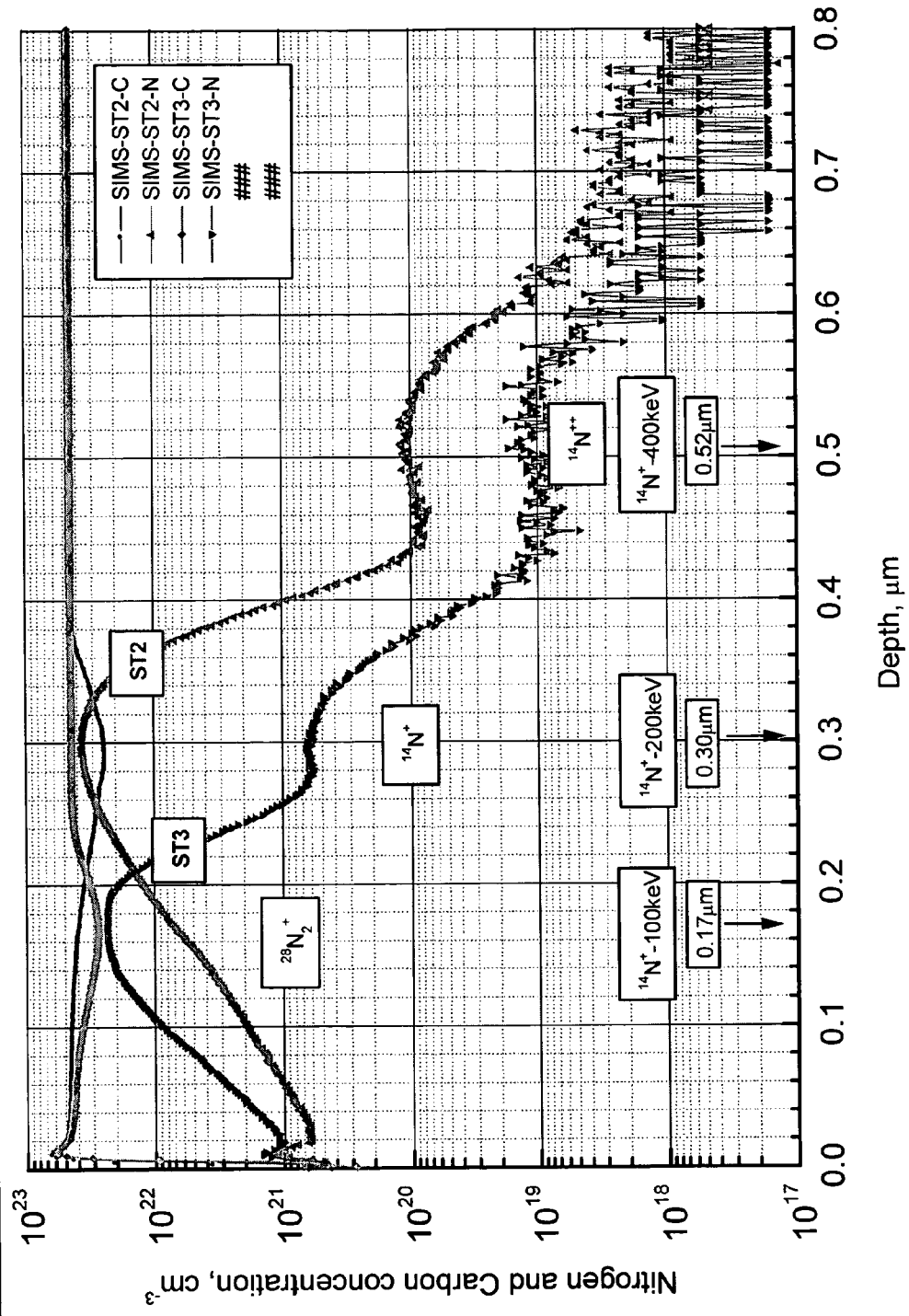
FIG. 9 is a logarithmic scale plot of the same data of FIG. 8.

FIG. 9 is a plot of SIMS data showing nitrogen and carbon concentration on a logarithmic scale as against depth in a 4H silicon carbide sample. A portion of the graph as indicated shows 4H silicon carbide implanted by atomic nitrogen at a dosage of 7E17 $cm^{-2}$ at an implantation energy of 200 keV while maintaining the substrate at 1100° C. Another portion represents 4H silicon carbide implanted by molecular nitrogen ($N_2^+$) at the same energy, but at a dose of 3.5E17 $cm^{-2}$ also at 1100° C. FIG. 10 illustrates several secondary peaks or shoulders in each of the nitrogen concentration profiles. These illustrate that, among other things, nitrogen can be implanted either as molecular nitrogen ($N_2^+$) or atomic nitrogen ($N^+$) to obtain essentially the same results and also that an ion beam filter can be used as desired or necessary to select any one or more of the implantation profiles desired for any particular crystal.

FIG. 10 is a linear scale plot of a TRIM simulation for silicon carbide and silicon nitride layers implanted with atomic nitrogen at a dosage of 7E17 $cm^{-2}$ and energy f 200 keV. As illustrated in FIG. 10, implantation in silicon nitride should result in a slightly deeper profile than implantation in silicon carbide.

These plots, taken individually and collectively, demonstrate the ability of embodiments of the invention to produce a buried insulating layer within a layer of silicon carbide such that a surface portion of the silicon carbide layer remains above the insulating layer and the remainder of the silicon carbide layer lies below the buried insulating layer.

The plots also indicate that the crystal quality of the top silicon carbide layer remains high even after the nitrogen ions have penetrated at a relatively high dosage and energy. Implanting nitrogen in silicon carbide is preferable to implanting oxygen because nitrogen has a much lower diffusion rate in silicon carbide than does oxygen. Moreover, nitrogen's atomic mass (14) is less than that of oxygen (16), which helps reduce the extent of implantation damage in the top silicon carbide layer.

Embodiments of the invention may provide an insulating layer in any type of silicon carbide layer, specifically including any polytype and any conductivity type. The process may be easier to control than specialized doping or compensation schemes, is reproducible within a tolerance of about 5%, and provides the opportunity to grow another epitaxial layer on the top surface of the silicon carbide layer that is electrically insulated from a silicon carbide substrate.

FIGS. 11 through 14 illustrate additional embodiments of the invention and resulting structures based upon the advantages of embodiments of the present invention.

A bulk silicon carbide substrate or wafer 56 is illustrated in FIG. 11A. As illustrated in FIG. 11B, atomic or molecular nitrogen is implanted into the substrate 56 in the manner described above to form a buried layer 57 of silicon nitride which defines a silicon carbide surface layer 55 above the buried insulating layer 57.

As illustrated in FIG. 11C, a support substrate 64 may be bonded to surface layer 55. Support substrate 64 may comprise silicon carbide, silicon, gallium arsenide, sapphire, copper, aluminum, alumina, aluminum nitride, or any other suitable material. Support substrate 64 may provide mechanical support for layer 55 when it is separated from the remainder of the structure. Support substrate may also provide electrical contact to layer 55. Layer 55 may be separated (i.e. removed or lifted-off) from layer 56 by contacting the wafer and the silicon nitride layer 57 with a composition (typically an etchant) that removes silicon nitride compositions but not silicon carbide. Phosphoric acid ($H_3PO_4$) is a suitable etchant for this purpose, and the etch step is usually carrying out at an elevated temperature; e.g. about 100-150° C.

Once the buried insulating layer 57 has been etched away and substrate 56 removed, the structure illustrated in FIG. 11D remains, namely, a relatively thin silicon carbide layer 55 bonded to a support substrate 64. Epitaxial layers of silicon carbide or other materials such as a Group III-nitride may then be grown on silicon carbide layer 55, and/or electronic devices may be formed in layer 55.

Because epitaxial layers generally possess higher crystal quality than bulk substrate materials, it may be desirable to grow an epitaxial layer on substrate 56 for lift-off. Such an embodiment is illustrated in FIGS. 12A-12D. FIG. 12A is a schematic cross-section showing a bulk SiC substrate 56 on which an epitaxial layer 59 of silicon carbide has been formed. Atomic or molecular nitrogen is implanted in to the epitaxial layer 59 according to the methods described above to form a buried layer 57 of silicon nitride which defines a silicon carbide surface layer 59B above the buried insulating layer 57 as shown in FIG. 12B.

As illustrated in FIG. 12C, a support substrate 64 may be bonded to surface layer 59B. Layer 59B may be separated from substrate and optional remaining epitaxial layer 59A by contacting the wafer and the silicon nitride layer 57 with an etchant such as phosphoric acid as described above, resulting in the structure illustrated in FIG. 12D, namely, a thin, high quality epitaxial layer 59B of silicon carbide bonded to a support substrate 64. As with the embodiments illustrated in connection with FIG. 11D, the resulting structure may provide a template for further growth of homoepitaxial or heteroepitaxial semiconductor layers (not shown). Alternatively, one or more electronic devices may be formed directly within or upon layer 59B.

Figure 13A:
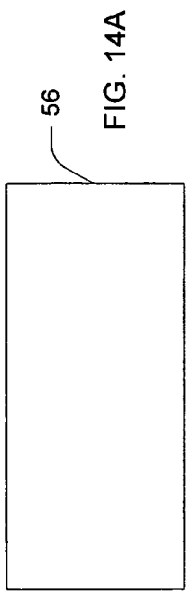
Figure 13B:
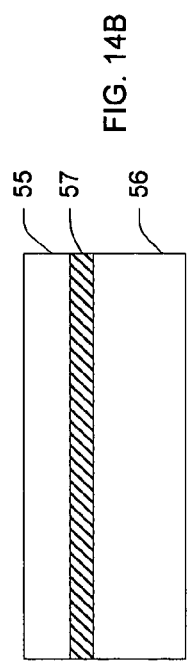
Figure 13C:
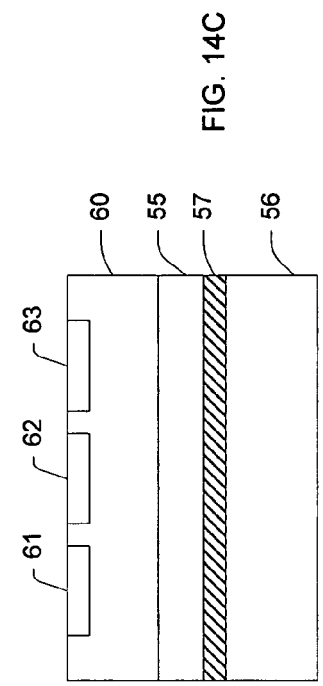

FIGS. 13A through 13D illustrate further related embodiments of the invention. Beginning with a bulk silicon carbide substrate 56 illustrated in FIG. 13A, atomic or molecular nitrogen is implanted into the substrate 56 in the manner described above to form a buried layer 57 of silicon nitride which defines a silicon carbide surface layer 55 above the buried insulating layer 57 as shown in FIG. 13B. As illustrated in FIG. 13C, an epitaxial layer 60 of silicon carbide or another suitable material such as a Group III-nitride may be grown on surface layer 55. An optional support substrate 64 may be bonded to epitaxial layer 60. In some embodiments, epitaxial layer 60 may be grown thick enough such that no additional support layer is required.

Figure 13D:
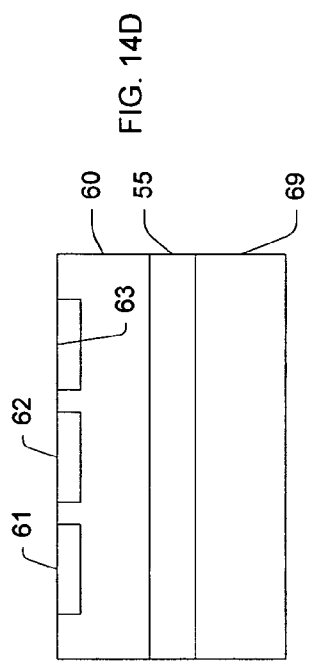

Layer 55 may be separated from substrate 56 by contacting the wafer and the silicon nitride layer 57 with an etchant such as phosphoric acid as described above, resulting in the structure illustrated in FIG. 13D, namely, a high quality epitaxial layer 60 of silicon carbide formed on layer 55 and optionally bonded to a support substrate 64. As with the embodiments illustrated in connection with FIGS. 11D and 12D, the resulting structure may provide a template for further growth of homoepitaxial or heteroepitaxial layers (not shown). Alternatively, one or more electronic devices may be formed directly within or upon the remaining silicon carbide layers.

Figure 14A:
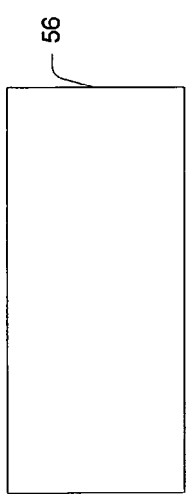
Figure 14B:
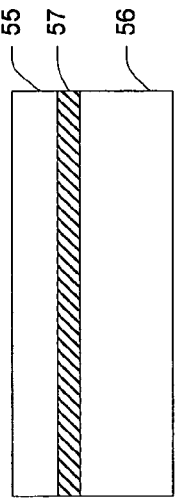
Figure 14C:
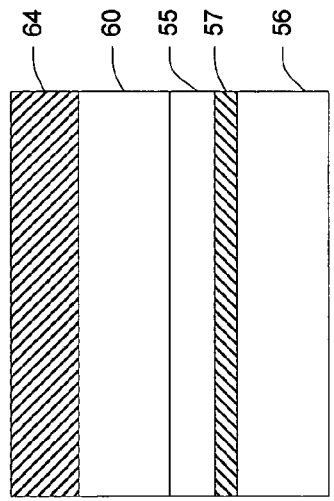
Figure 14D:
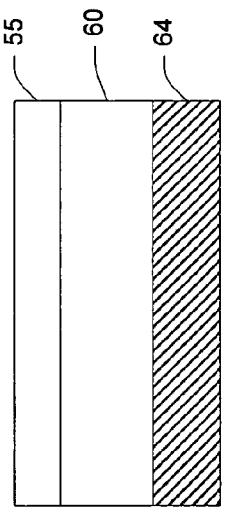

Similarly, a silicon carbide substrate 56 is provided (FIG. 14A). Atomic or molecular nitrogen is implanted into the substrate 56 in the manner described above to form a buried layer 57 of silicon nitride which defines a silicon carbide surface layer 55 above the buried insulating layer 57 as shown in FIG. 14B. A thick epitaxial layer 60 is again grown on the upper silicon carbide layer 55. Additionally, device or pre-device elements shown as the respective regions 61, 62, and 63 are included or formed in (or upon) the thick epitaxial layer 60 as illustrated in FIG. 14C. The buried insulating layer 57 can then be removed taking the remainder of the substrate portion 56 along with it to result in the device or pre-device structure illustrated in FIG. 14D. As a further step, the structure of FIG. 14D can be inverted and an additional epitaxial layer 69 can be grown on the opposite surface of the remaining thin substrate 55. The technique may be is particularly attractive for power devices in which the thickness of the device affects the ability of the device to block high voltages or provides other functional advantages.

In other embodiments, a support substrate 64 may be bonded to layer 60 or layer 55 to provide mechanical support and/or electrical contact.

In the drawings and specification there has been set forth a preferred embodiment of the invention, and although specific terms have been employed, they are used in a generic and descriptive sense only and not for purposes of limitation, the scope of the invention being defined in the claims.

That which is claimed is:

1. A method of fabricating a silicon nitride region in silicon carbide, the method comprising:
    implanting nitrogen ions selected from the group consisting of atomic nitrogen ions and molecular nitrogen ions at a dose of between about $5 \times 10^{17}$ and $4 \times 10^{18}$ ions per square centimeter at an energy of between about 50 and 300 keV into a silicon carbide layer;
    while maintaining the silicon carbide layer at a temperature between about 350° C. and 1000° C. to prevent or moderate implant damage to the silicon carbide crystal to form an as-implanted region of silicon nitride in the silicon carbide layer; and
    thereafter annealing the as-implanted region at a temperature less than a temperature that would produce undesired effects on the silicon carbide crystal and for a time sufficient to form a silicon nitride composition insulating region in the silicon carbide layer with a thickness sufficient to reduce capacitive coupling of devices and circuits formed in the surface layer with the underlying silicon carbide layer.

2. A method according to claim 1, wherein the silicon nitride region comprises a buried layer formed beneath a surface layer of silicon carbide.

3. A method according to claim 1 comprising forming the buried insulating layer with a thickness of at least 1000 angstroms.

4. A method according to claim 1 comprising annealing the region at a temperature of between about 800° C. and 1700° C.

5. A method according to claim 1 comprising annealing the region at a temperature of between about 1200° C. and 1500° C.

6. A method according to claim 1 comprising maintaining the silicon carbide layer at a temperature of at least about 30° C. while implanting the nitrogen ions.

7. A method according to claim 1 comprising:
    implanting the nitrogen ions at a dose of at least $7 \times 10^{17}$ ions per square centimeter at an energy of at least about 200 keV; and while
    maintaining the silicon carbide layer at a temperature of at least about 650° C.; and thereafter
    annealing the implanted region at a temperature of about 1600° C. for about 5 minutes.

8. A method according to claim 1 further comprising selectively masking portions of an integrated circuit formed on a silicon carbide layer with a masking material that prevents penetration of nitrogen ions prior to the step of implanting the nitrogen ions.

9. A method according to claim 8 further comprising growing an epitaxial layer of silicon carbide on the implanted silicon carbide layer prior to the step of selectively masking portions of the integrated circuit.

10. A method according to claim 9 further comprising forming the integrated circuit in the grown epitaxial layer prior to the step of selectively masking portions of the integrated circuit.

11. A method according to claim 1 further comprising growing an epitaxial layer of silicon carbide on the implanted silicon carbide layer after the step of implanting the nitrogen.

* * * * *